United States Patent
Jang et al.

(10) Patent No.: US 6,762,417 B2
(45) Date of Patent: Jul. 13, 2004

(54) SYSTEM IN WHICH A ROTATING BODY IS CONNECTED TO A ROTARY SHAFT IN AN ION IMPLANTER

(75) Inventors: Jin-Hyeung Jang, Hwsang-Gun (KR); Hak-Young Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 10/211,358

(22) Filed: Aug. 5, 2002

(65) Prior Publication Data

US 2003/0034741 A1 Feb. 20, 2003

(30) Foreign Application Priority Data

Aug. 16, 2001 (KR) ........................................ 2001-49319

(51) Int. Cl.$^7$ ............................ A01J 37/20; G21K 5/10; H01J 37/317
(52) U.S. Cl. ............................... 250/442.11; 250/440.11; 250/441.11; 250/492.3; 250/452.1; 250/492.21; 250/492.22; 204/298.25; 315/111.81; 474/35; 474/37; 474/133; 474/161
(58) Field of Search ....................... 250/440.11, 441.11, 250/442.11, 492.1, 492.2, 492.21, 492.22, 492.3, 493.1; 204/298.25; 315/111.81; 474/35, 37, 11, 133, 161, 178; 475/19, 178, 183, 210, 240, 93, 89

(56) References Cited

U.S. PATENT DOCUMENTS

| 4,234,797 A | * | 11/1980 | Ryding | 250/492.3 |
| 4,587,431 A | * | 5/1986 | Uemura | 250/442.11 |
| 5,406,088 A | * | 4/1995 | Brune et al. | 250/442.11 |
| 6,313,469 B1 | * | 11/2001 | Tamai | 250/442.11 |
| 6,437,351 B1 | * | 8/2002 | Smick et al. | 250/492.21 |

* cited by examiner

Primary Examiner—John D. Lee
Assistant Examiner—David A. Vanore
(74) Attorney, Agent, or Firm—Volentine Francos, PLLC

(57) ABSTRACT

A rotary shaft and a rotating body are connected in such a way as to stably control the tilt of a wafer platen in an ion implanter. The rotary shaft has a key way and the rotating body has a boss into which the rotary shaft extends. A key integrates the rotary shaft and the rotary body so that they rotate together without slipping relative to each other. An end cap is screwed onto the rotary body over the end of the rotary shaft and the key. As a result, the wafer platen can be maintained at an accurate orientation or tilt relative to the ion beam produced by the implanter.

43 Claims, 19 Drawing Sheets

SYSTEM IN WHICH A ROTATING BODY IS CONNECTED TO A ROTARY SHAFT IN AN ION IMPLANTER

BACKGROUND OF THE INVENTION

1. Field of the Invention

The present invention relates to an assembly for tilting a wafer platen of an ion implanter for manufacturing semiconductor devices. More particularly, the present invention relates to the connection between a rotating body and a shaft of a transmission mechanism for transmitting a drive force to the wafer platen.

2. Description of the Related Art

Ion implantation is a semiconductor manufacturing technique in which impurities are ionized, accelerated, and implanted into a desired area of a semiconductor substrate. Furthermore, ion implantation allows the impurities to be selectively implanted with accurate control. In addition, ion implantation can be performed with excellent process reproducibility and process uniformity. Therefore, the ion implantation process lends itself well to the mass-production of highly integrated semiconductor devices. Accordingly, the role of ion implantation in the semiconductor manufacturing process is continuing to gain in importance.

For maximum efficacy of the implantation process, it is known that a semiconductor wafer should be oriented at a predetermined angle relative to the ion beam. However, the wafer may be supported unstably while being tilted. Facility inspections have uncovered problems in the attachment of a drive shaft to a rotating arm controlling the Y-axis tilt of the wafer, and the attachment of a rotary shaft to a pulley controlling the X-axis tilt of the wafer. When these problems exist, the impurities are implanted to different depths in various portions of the wafer instead of being implanted to a uniform depth. Thus, these problems adversely affect the reliability of the facilities and the productivity of the manufacturing process.

The orienting of a wafer platen of the ion implanter will now be briefly described with reference to FIG. 5. The wafer platen 75 can be moved in the direction of arrows A" for controlling the X-axis tilt and in the direction of arrows B' for controlling the Y-axis tilt.

FIG. 1 illustrates a connecting system for controlling the Y-axis tilt of a wafer platen in an implanter according to the prior art. Referring to FIG. 1, the connecting system includes a drive shaft 6, a rotating arm 10, ferrules 8, a bracket 14, and screws 12. The drive shaft 6 is rotated by a drive motor 2. Reference numeral 4 designates a plate to which the motor 2 is fixed. The rotating arm 10 is engaged with the drive shaft 6 so as to be rotated by the same. The ferrules 8 are positioned between the rotating arm 10 and the drive shaft 6. The bracket 14 tightens the ferrules 8 and holds the drive shaft 6. The screws 12 fix the bracket 14 onto the side of the rotating arm 10.

The ferrules 8 have alternating flat and angled outer edges, and are disposed on the outside of the drive shaft 6. Because the bracket 14 is fixed on the rotating arm 10, the ferrules 8 transmit the rotary force of the drive shaft 6 to the rotating arm 10. However, the ferrules 8 slip relative to the drive shaft 6 because both the drive shaft 6 and the ferrules 8 are made of steel. The rotation of the drive shaft 6 is thus not completely transmitted to the rotating arm 10, and the wafer platen (not shown) is oriented inaccurately by the rotating arm 10.

FIG. 2 is a graph showing encoder values and surface resistance values of a drive motor for controlling Y-axis tilt, by date, using the connecting system shown in FIG. 1. Reference numerals 21 through 23 designate plots showing the distribution of the surface resistance values against the angle of the ion beam for finding the encoder values of the drive motor corresponding to the zero point of the Y-axis tilt. Reference numerals 31 through 33 designate plots showing the distribution of the surface resistance values against the angle of the ion beam when the drive motor was operated under encoder values corresponding to the zero point of the Y-axis tilt. Reference numerals 41 through 43 designate plots showing the distribution of the surface resistance values against the angle of the ion beam for finding the encoder values of the drive motor corresponding to the zero point of the Y-axis tilt, after the drive motor had been operated for a certain period of time.

First, on April $2^{nd}$, an encoder value −64.61 mm of the drive motor was finally obtained through first (21), second (22), and third tests (23) in order to establish the zero point of the Y-axis tilt. The absolute value of the surface resistance at an angle of −1° of the ion beam is similar to the absolute value of the surface resistance at an angle of +1° of the ion beam on the plot 23, yielding encoder values suitable to set the zero point. Here, the surface resistance values are symmetrical about the angle of 0° of the ion beam.

On April 30, the surface resistance values at an angle of −1−+1° of the ion beam were compared through first (31), second (32), and third tests (33) after the encoder value of the drive motor, in which the zero point had been set, was set to −64.61 mm. However, as the tests, showed, the absolute values of the surface resistance were not symmetrical about the angle of 0° of the ion beam. Thus, the angle of the ion beam was determined to vary even though the drive motor was operated by the same encoder values.

On May $4^{th}$, encoder values of the drive motor were obtained through first (41), second (42), and third tests (43) when the absolute values of the surface resistance were symmetrical about the angle of 0° of the ion beam. The encoder values of the drive motor obtained through these tests were −65.85 mm, −65.05 mm, and −65.15 mm, which are different from the encoder value −64.61 mm of the drive motor in which the zero point was first set. Thus, it was apparent that the connection between the drive shaft and the rotating arm in the system for controlling the Y-axis tilt was creating a problem.

FIGS. 3 and 4 illustrate a drive system for controlling the X-axis tilt in an ion implanter according to the prior art. Referring to these figures, the drive system includes rotary shafts 53 and 59, drive and follower pulleys 51 and 57, a belt 65 wrapped around the pulleys 51 and 57, spacers 63 and 73 spacing the shafts 53 and 59 from the pulleys 51 and 57, respectively, and nuts 61 and 71 for tightening the spacers 63 and 73. Reference numeral 67 designates a boss of the follower pulley 57.

The rotary output of a drive motor is transmitted to the follower pulley 57 by the belt 65. The rotary force of the follower pulley 57 is, in turn, transmitted to the rotary shaft 59 connected to the follower pulley 57 by the nut 61. The shaft 59 rotates a wafer platen connecter 69 for controlling the X-axis tilt (angle of the wafer platen). In this drive system, the follower pulley 57 will slip relative to the shaft 59 if the nut 61 becomes loose. Also, slip occurs between the shaft 59 and the spacer 63 because both the shaft 59 and the spacer 63 are made of steel. Accordingly, the drive shaft 53 does not completely transmit its rotary force to the shaft 59.

Thus, the angle of the wafer platen (not shown) is set inaccurately by the shaft 59.

SUMMARY OF THE INVENTION

An object of the present invention is to solve the above-described problems. More specifically, an object of the present invention is to provide a mechanism in which a rotating body and a rotary shaft are connected in a tilt assembly of an ion implanter such that the orientation or tilt of a wafer platen can be accurately controlled with respect to the ion beam.

To achieve the above object, according to a first aspect of the present invention, the rotary shaft has a key way extending parallel to the longitudinal axis of the shaft and at least one internally threaded hole in an end surface thereof. The rotating body has a boss defining a protrusion, and a plurality of internally threaded holes in one side thereof. The protrusion forms a key that extends in the key way of said rotary shaft. An end cap is screwed to the rotary shaft and the rotary body via the internally threaded holes thereof to thereby join the rotary shaft and the rotating body.

The rotary shaft may be a drive shaft of a transmission mechanism for use in controlling the Y-axis tilt of the wafer platen, or may be a drive shaft or a follower shaft of a transmission mechanism for use in controlling X-axis tilt of a wafer platen. The rotating body may be a rotating arm of a transmission mechanism for use in controlling the Y-axis tilt of the wafer platen, or may be a drive pulley or a follower pulley of a transmission mechanism for use in controlling the X-axis tilt.

Preferably, the key way has the shape of a trench shape in which the bottom and sidewalls are perpendicular to each other. The rotary shaft preferably has only one internally threaded hole therein, the hole formed at the center of the end surface of the shaft. On the other hand, the rotating body preferably has six internally threaded holes. Whereas the rotating body is preferably formed of steel, the screws are preferably formed of SUS.

To achieve the above object, according to a second aspect of the present invention, the rotary shaft has a key way extending parallel to the longitudinal axis thereof, the rotating body has a boss into which the shaft extends and a plurality of internally threaded holes, at least one ferrule is interposed between the rotary shaft and the rotating body within the boss of the rotating body, a key extends into the key hole, a bracket has a supporting plate having a keyhole in which an end of the key is fitted and a pressure ring pressing against the ferrule, and an end cap covers the keyhole. Screws join the bracket and the end cap to the rotating body.

The rotary shaft may be a drive shaft and the rotating body may be a rotating arm of a transmission mechanism for use in controlling the Y-axis tilt of a wafer platen. The rotating arm is formed of steel.

Preferably, the key way has the shape of a trench in which the bottom and sidewalls are perpendicular to each other. The key has an end that preferably is spaced from the end of the key way within the rotary shaft. Also, the cross section of the keyhole preferably has the same shape and size as that of the key.

To achieve the above object, according to a third aspect of the present invention, the rotary shaft has a key way extending perpendicular to the longitudinal axis of the shaft in an end surface thereof, and the rotating body has a boss into which the shaft extends, and a plurality of internally threaded holes and a key way open at one side of the rotating body. A spacer is disposed in the boss of the rotating body as interposed between the rotary shaft and the rotating body. A nut tightens the spacer at the outside of the spacer. A key is fitted in the key ways of the rotary shaft and rotating body. An end cap contacts the key and is screwed to the rotating body via the internally threaded holes thereof.

The rotary shaft may be a drive shaft or a follower shaft of a transmission mechanism for use in controlling the X-axis tilt of a wafer platen. The rotating body may be a drive pulley or a follower pulley of the transmission mechanism, and the rotating body is formed of steel.

Preferably, the key way extends across the central axis of rotation of the shaft, and has a rectangular cross section. Also, the cross section of the key way of the rotating body preferably has the same shape as that of the key way of the rotary shaft, and the bottom surface of the key way of the rotating body lies in the same plane as the bottom surface of the key way of the rotary shaft. Still further, the widths of the key, the key way of the rotary shaft, and the key way of the rotating body are preferably equal, and the thickness of the key is greater than the depths of the key ways.

To achieve the above object, according to a fourth aspect of the present invention, the rotary shaft has a key way extending perpendicular to the longitudinal axis thereof in an end surface of the shaft, the rotating body has a boss into which the rotary shaft extends and a plurality of internally threaded holes at one side of the body, and the key way of the rotary shaft has bottom surface recessed within the side of the rotating body. A spacer is disposed within the boss of the rotating body as interposed between the revolving shaft and the rotating body. A nut tightens the spacer at the outside of the spacer. A key is fitted in the key way of the rotary shaft and extends therefrom. An end cap contacts the key and is screwed to the rotating body via the internally threaded holes thereof to join the key to the rotating body.

The rotary shaft may be a drive shaft or a follower shaft of a transmission mechanism for use in controlling the X-axis tilt of a wafer platen. The rotating body may be a drive pulley or a follower pulley of the transmission mechanism.

Preferably, the width of the key is equal to the width of the key way.

According to the present invention, a rotary shaft and a rotating body are integrated by at least a key so as to rotate as one, i.e., without slip occurring between the rotary shaft and the rotating body. Thus, an accurate ion beam angle is maintained. Also, the reliability of the ion beam implanter is increased, and fewer implanted wafers are rejected thereby increasing the productivity of the semiconductor manufacturing process.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENTS

The present invention will now be described in detail with respect to assemblies for orienting a wafer platen of an ion implanter. However, the present invention is applicable to various systems in which the force from a rotary shaft is transmitted to a rotating body.

Figure 5:
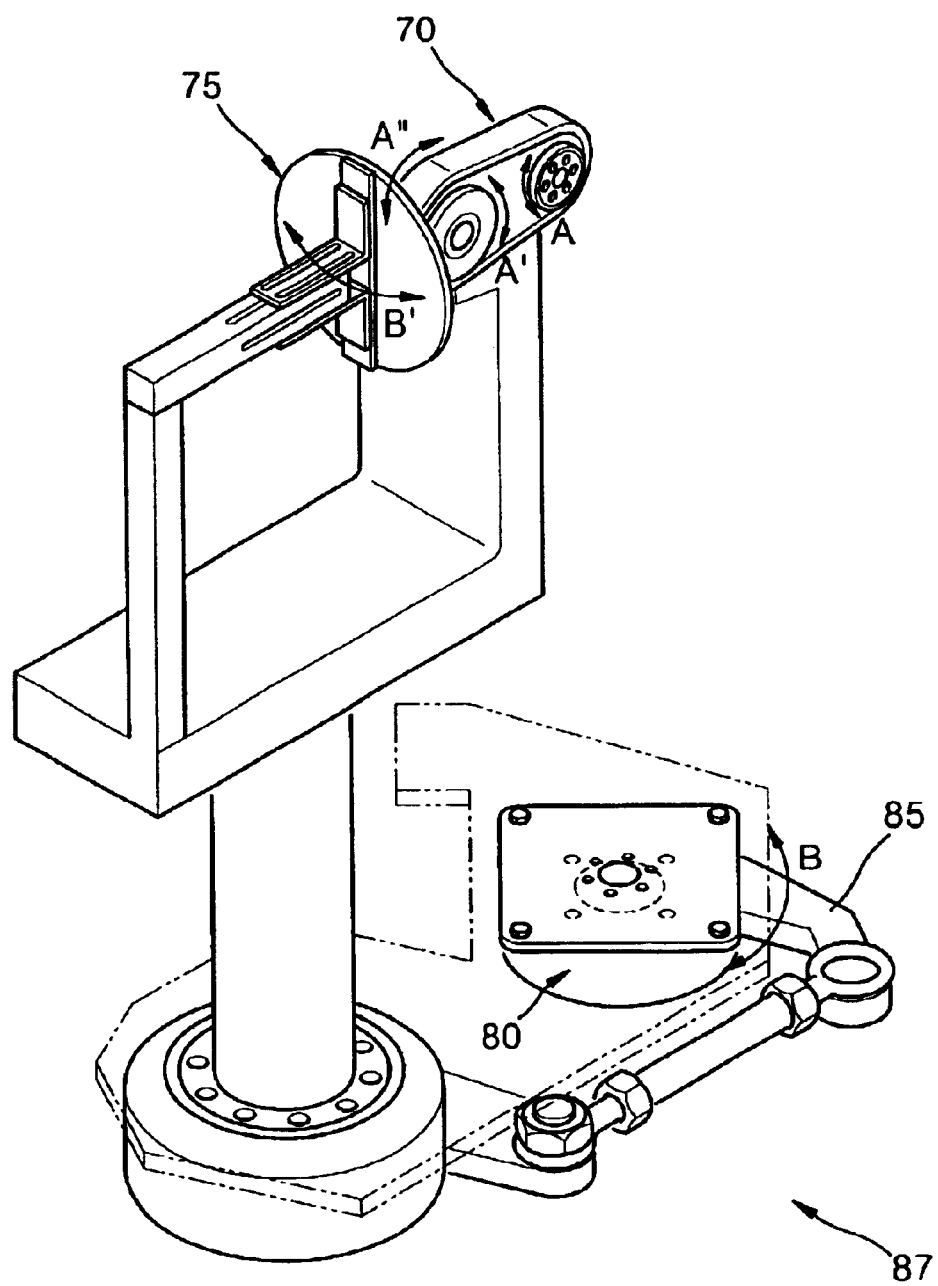
FIG. 5 is a perspective view of an ion implanter to which preferred embodiments of the present invention are applied.

The basic configuration of the ion implanter will first be described with reference to FIG. 5. The ion implanter includes a wafer platen 75 that supports a wafer at a predetermined orientation or "tilt" relative to an ion beam. The position of the wafer platen 75 is adjustable such that the angle of the ion beam relative to the wafer can be controlled.

In particular, the position of the wafer platen 75 can be adjusted along the direction indicated by arrow A" using an X-axis tilt assembly to set the X-axis tilt. More specifically, the output of an X-axis tilt drive motor (not shown) is transmitted to the wafer platen 75 by a transmission mechanism 70. The transmission mechanism 70 includes a pair of pulleys and a belt. One of the pulleys is rotated by a rotary shaft in the direction indicated by arrow A, whereas the other pulley is driven by a belt in the direction indicated by arrow A' to set the X-axis tilt.

The position of the wafer platen 75 can also be adjusted to set the Y-axis tilt along the direction indicated by arrow B' using a Y-axis tilt assembly 87. More specifically, the output of a Y-axis tilt drive motor (not shown) is transmitted to the wafer platen 75 by a transmission mechanism 80. The transmission mechanism 80 includes an arm 85 driven for rotation in the direction indicated by arrow B by the output shaft of the motor.

The Y-axis tilt and X-axis tilt of the wafer platen 75 are set before ions are implanted onto a wafer, to establish the zero point of the wafer platen. In this process, the X-axis tilt and the Y-axis tilt are fixed to produce an incident angle of the ion beam of 0°. Encoder values of the drive motor for controlling the Y-axis tilt and encoder values of the drive motor for controlling the X-axis tilt are obtained once this zero point of the wafer platen 75 is set. The driving motors are thus driven by certain increments from the zero point to establish a desired X-axis tilt and Y-axis tilt for an ion implantation process. However, as described above, according to the prior art, the connection of a drive shaft and a rotating arm in the assembly for controlling the Y-axis tilt and the connection of a rotary shaft and a pulley in the assembly for controlling the X-axis tilt allow the encoder values of the drive motors at the zero point to change over time. On the other hand, the present invention obviates such conditions and the problems associated therewith, as will now be described in detail below.

Figure 10:
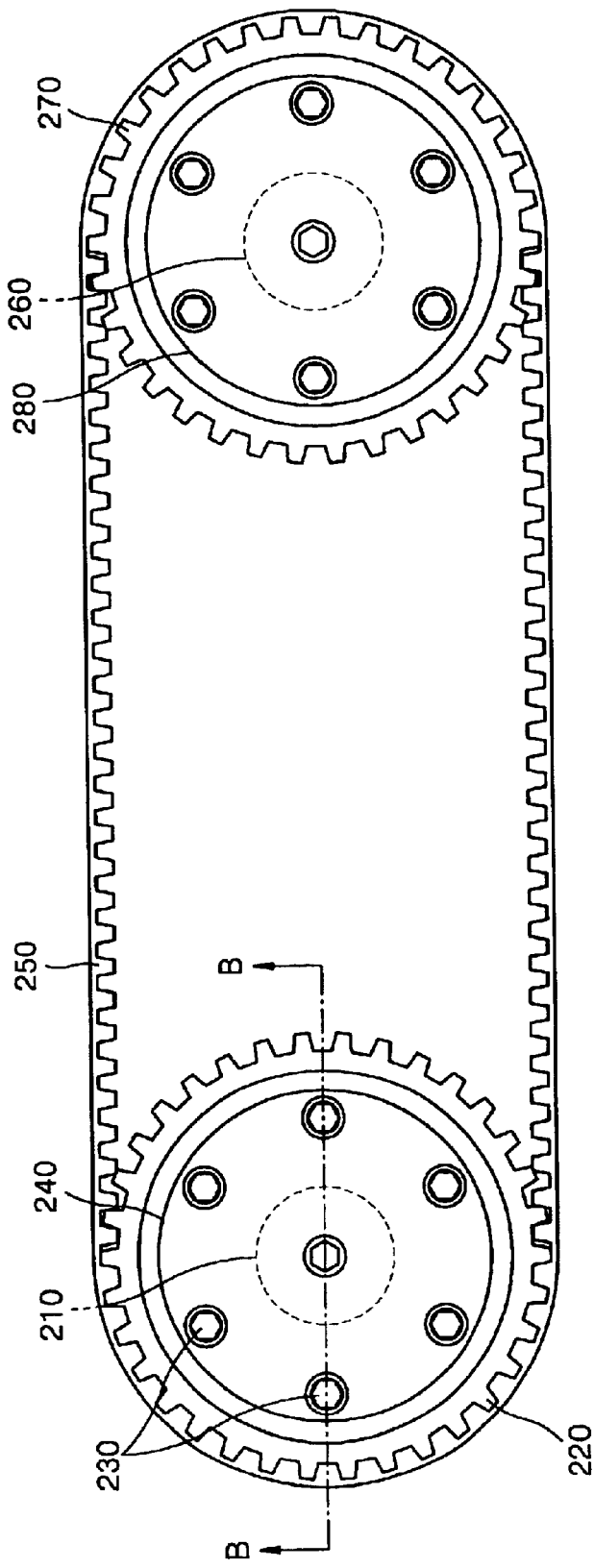
FIG. 10 is a side view of a system in which a pulley is connected to a rotary shaft for controlling the X-axis tilt of a wafer platen of an ion implanter according to a first embodiment of the present invention.
Figure 11:
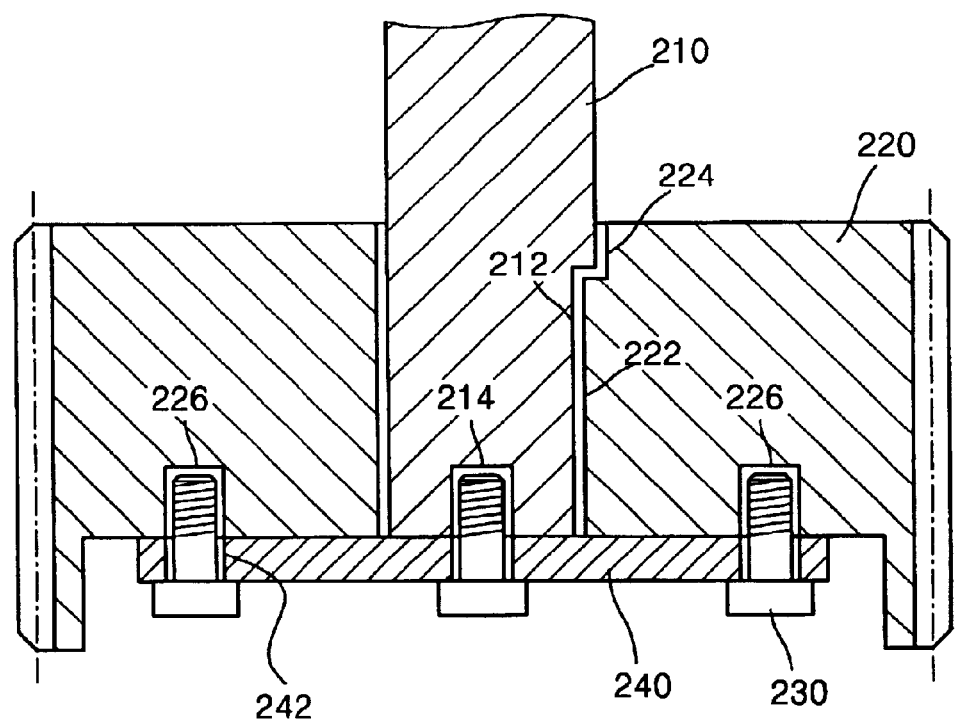
FIG. 11 is a cross-sectional view of the system shown in FIG. 10 taken along line B—B of FIG. 10.

FIGS. 6 through 11 illustrate first embodiments of transmission mechanisms of X-axis and Y-axis tilt assemblies of an ion implanter according to the present invention. In particular, FIGS. 6 through 9 illustrate a system in which a rotating body is connected to a drive shaft in the Y-axis tilt assembly, and FIGS. 10 and 11 illustrate a system in which a pulley is connected to a rotary shaft in the X-axis tilt assembly.

Figure 6:
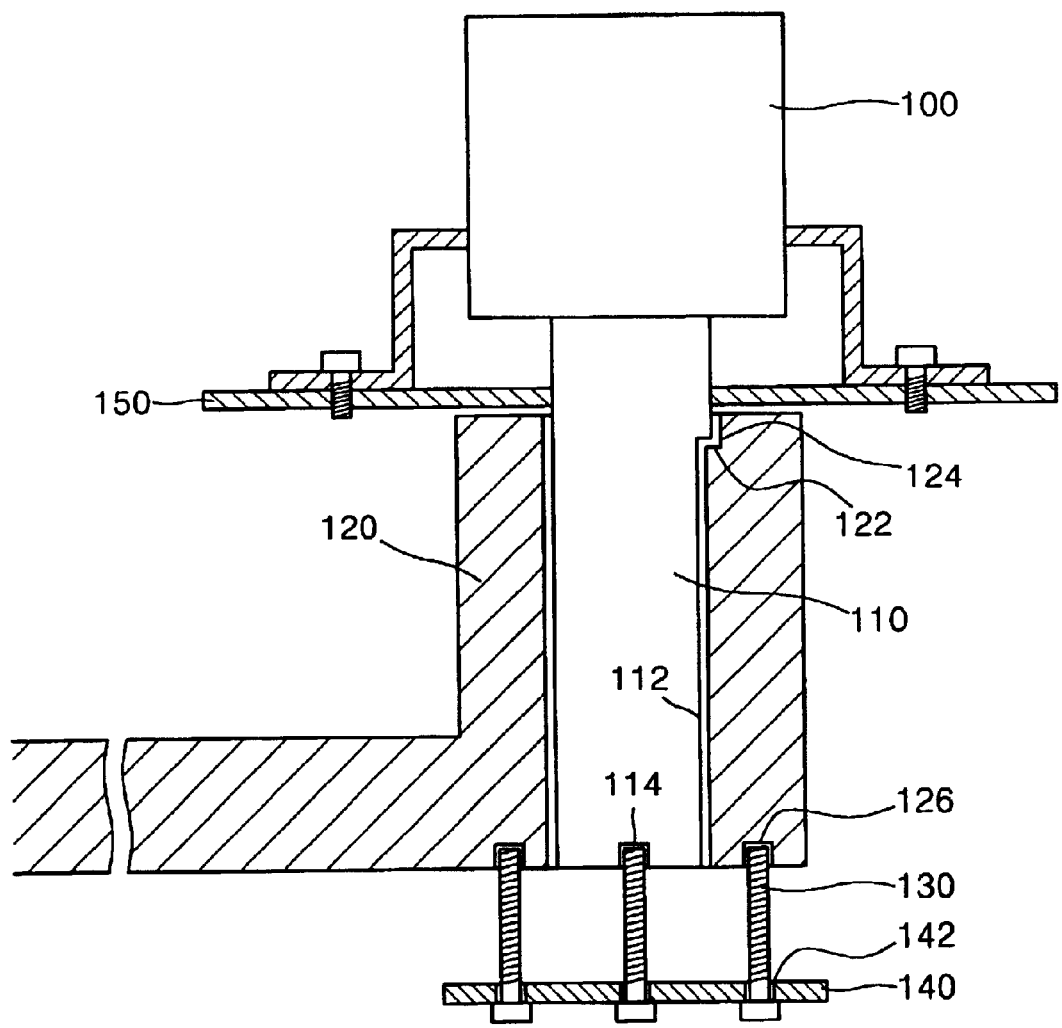
FIG. 6 is a cross-sectional view of a system in which a rotating arm is connected to a drive shaft for controlling the Y-axis tilt of a wafer platen of an ion implanter according to a first embodiment of the present invention.

Referring now to FIG. 6, the transmission mechanism includes a drive shaft 110 having a key way 112 and an internally threaded hole 114 therein, a rotating arm 120 engaging the shaft 110 within the key way 112 so as to rotate with the shaft 110, and an end cap 140 and screws 130 connecting the drive shaft 110 and the rotating arm 120.

Figure 7A:
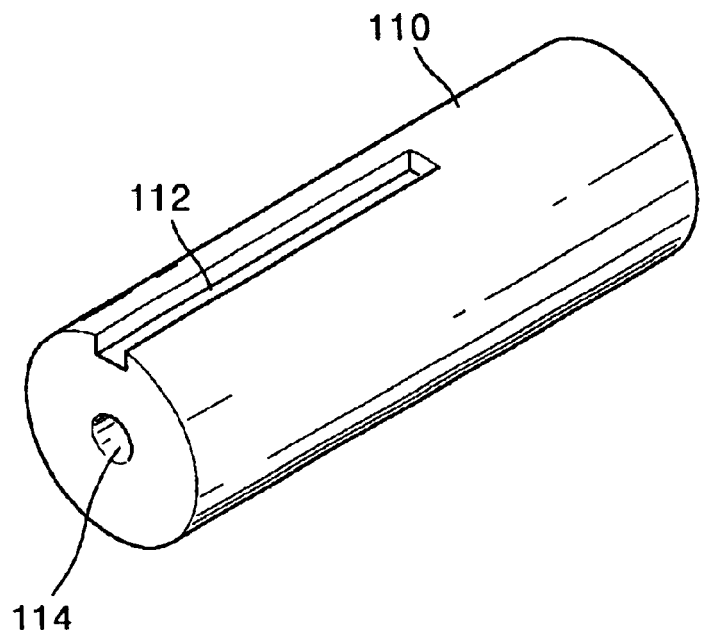
FIG. 7A is a perspective view of a drive shaft of the system shown in FIG. 6.
Figure 7B:
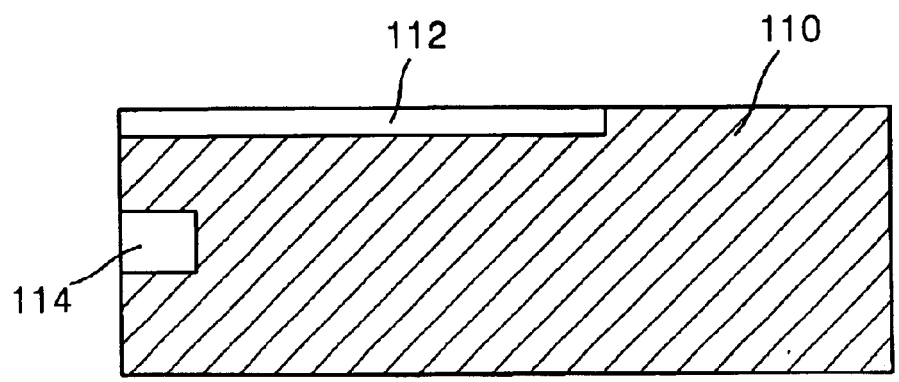
FIG. 7B is a sectional view of the drive shaft.
Figure 8A:
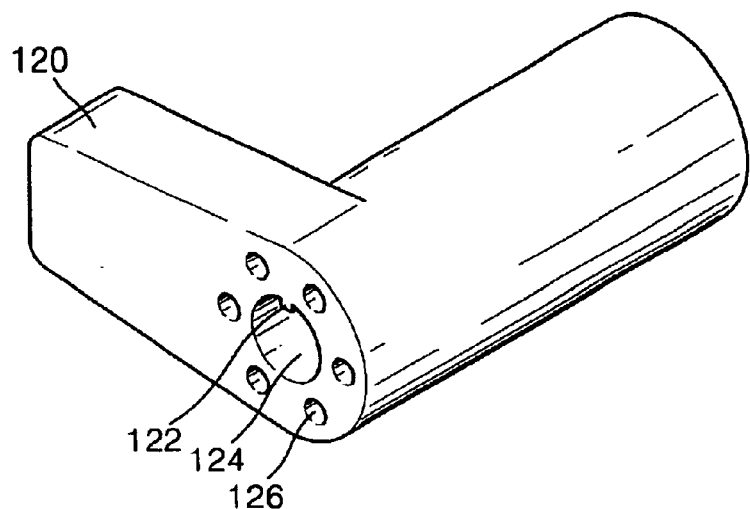
FIG. 8A is a perspective view of a rotating arm of the system shown in FIG. 6.
Figure 8B:
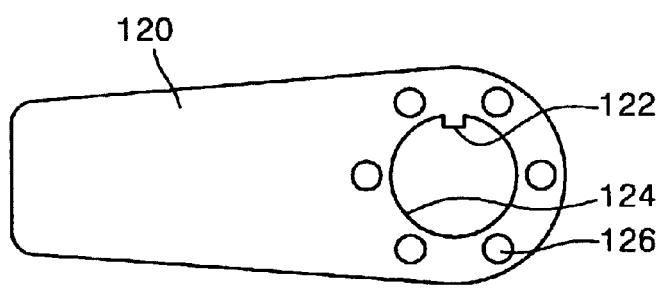
FIG. 8B is an end view of the rotating shaft 8B.
Figure 8C:
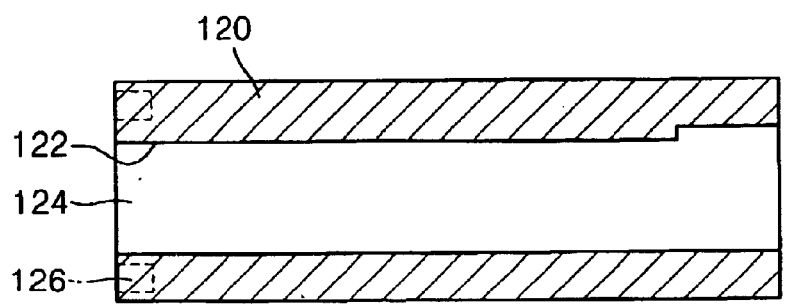
Figure 9:
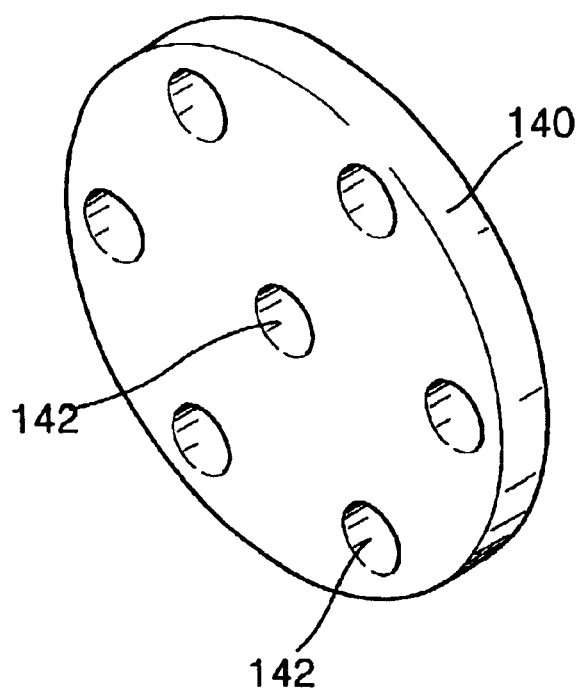
FIG. 9 is a perspective view of an end cap of the system shown in FIG. 6.

Referring also now to FIGS. 7A and 7B, the key way 112 extends along the outer surface of the drive shaft 110 in a direction parallel to the central longitudinal axis (axis of rotation) of the drive shaft 110. Preferably, the surfaces defining the bottom and sidewalls of the key way 112 are perpendicular to each other. One end of the key way 112 is closed so that the rotating arm 120 is positioned on the drive shaft 110 by the key way 112 when the rotating arm 120 is coupled to the drive shaft 110.

Referring to FIGS. 6 and 8A through 8C, a boss 124 of the rotating arm 120 has a protrusion (key) 122 which is received in the key way 112 of the drive shaft 110.

Preferably, the cross section of the protrusion 122 is identical to the cross section of the key way 112. Thus, the rotating arm 120 and the drive shaft 110 are made integral such that the rotating arm 120 rotates when the drive shaft 110 rotates. That is, the protrusion 122 and keyway 112 are a means for directly transmitting rotary force between the drive shaft 110 and the rotating arm 120. Accordingly, the protrusion 122 serves to rotate the rotating arm 120 without allowing the arm 120 to slip about the drive shaft 110, A drive motor 100 for controlling the Y-axis tilt of a wafer platen is connected to one end of the drive shaft 110 for rotating the drive shaft 110 and hence, the rotating arm 120. The drive motor 100 is fixed to a support plate 150.

The internally threaded hole 114 is formed in the other end of the drive shaft 110. Preferably, the internally threaded hole 114 is formed at the center of the end surface of the drive shaft 110 to receive one of the screws 130. Alternatively, a plurality of internally threaded holes 114 may be formed symmetrically around the center of the end surface of the drive shaft 110 and respective screws 130 may be threaded thereto in order to lessen the impact of the shear force on each of the screws 130 connecting the drive shaft 110 to the rotary arm 120.

The rotating arm 120 has a plurality of internally threaded holes 126 formed in an end thereof. Respective ones of the screws 130 are coupled to the internal threads. Preferably, the end cap 140 is a flat circular plate (see FIG. 9) having screw holes 142 through which the screws 130 extend. The internally threaded holes 114 and 126 of the drive shaft 110 and rotating arm 120 are aligned with the screw holes 142 in the end cap 140, and the screws 130 are inserted through the holes 142 and into the threaded holes 114 and 126 to couple the drive shaft 110 to the rotating arm 120. Preferably, there are six internally threaded holes 126. Also, the threads of the internally threaded holes 126 are preferably steel threads. On the other hand, the screws 130 are preferably made of SUS which is thermally treated.

The end cap 140 holds the screws 130 together so that the protrusion 122 of the rotating arm 120 is held close to the drive shaft 110 within the key way 112. Also, the end cap 140 supplements the transmission of rotary force between the drive shaft 110 and the rotating arm 120.

Referring now to FIGS. 10 and 11, the connection of a follower pulley to a follower shaft, according to the present invention, will be described. However, this connection is equally applicable to that of a drive pulley to a drive shaft.

In any case, a drive motor (not shown) is driven to control the X-axis tilt of the wafer platen. The rotary force of the drive motor is transmitted to a drive pulley 270 and a belt 250 is driven by the rotation of the drive pulley 270. The movement of the belt 250 is transmitted to a follower pulley 220 and the rotary force of the follower pulley 220 is transmitted to a rotary shaft 210. The rotary shaft 210 is, in turn, connected to a wafer platen connecter.

As best shown FIG. 11, the rotary shaft 210 has a key way 212 extending parallel to the central longitudinal axis thereof, and an internally threaded hole in an end surface thereof. The follower pulley 220 has a boss 224 defining a protrusion (key) 222 received within the key way 212, and a plurality of internally threaded holes 226 in a side surface thereof. An end cap 240 has a central screw hole 242 opposite the internally threaded hole 214 of the rotary shaft 210, and circumferential screw holes 242 opposite the internally threaded holes 226 of the follower pulley 220. Screws 230 join the end cap 240 to the rotary shaft 210 and the follower pulley 220.

The structure, material, function, and effect of the connection between the follower pulley 220 and the rotary shaft 210 (and/or between the drive shaft 260 and the drive pulley 270), and between the end cap 240 and the pulley, are the same as those described in connection with the assembly for controlling the Y-axis tilt of the wafer platen.

FIGS. 12 through 14B illustrate a second embodiment of a transmission mechanism of an X-axis or a Y-axis tilt assembly of an ion implanter according to the present invention. For purposes of description only, the second embodiment will be described in connection with the Y-axis tilt assembly of an ion implanter.

The transmission mechanism for transmitting a driving force to wafer platen in a Y-axis tilt assembly of an ion implanter includes a drive shaft 310 connected to a drive motor 370, a rotating arm 320 whose rotation tilts the wafer platen about a Y-axis, ferrules 330, a bracket 340, a key 380, an end cap 350, and screws 360. The drive shaft 310 has a key way 312 extending parallel to the central longitudinal axis (of rotation) thereof. The key way 312 has a blind end within the drive shaft 310. The rotating arm 320 has a boss into which the drive shaft 310 extends, and a plurality of internally threaded holes 324 at one side thereof. The rotating arm 320 is preferably made of steel. The ferrules 330 are interposed between the drive shaft 310 and the rotating arm 320 within the boss 322. The bracket 340 includes a supporting plate 348 having a keyhole 344 and screw holes 346, and a pressure ring 342 protruding from the supporting plate 348. The key 380 is fitted to the supporting plate and drive shaft 310 within the keyhole 344 and the key way 312. The end cap 350 urges the key 380 into and fixes the key 380 in place.

The ferrules 330 are embedded in the drive shaft 310, and have alternating flat and angled outer edges. The ferrules 330 transmit the rotary force of the drive shaft 310 to the rotating arm 320. The rotating arm 310 and the ferrules 330 are made of steel. According to the present invention, the key 380 and the end cap 350 prevent the ferrules 330 from slipping relative to the drive shaft 310 so that the rotary force of the drive shaft 310 is completely transmitted to the rotating arm 320.

The key 380 is embedded in the drive shaft 310 and supporting plate 348 within the keyhole 344 and the key way 312, and completely prevents slip from occurring during the transmission of the rotary force by the ferrules 330. To this end, the keyhole 344 preferably has the same shape and size as the key 380. Accordingly, the key 380 integrates the drive shaft 310 and the rotating arm 320 such that the rotating arm 320 rotates as one with the drive shaft 310 without slipping so that the Y-axis tilt of the wafer platen can be accurately set. Also, if the drive motor 370 fails, the drive shaft 310 and the rotating arm 320 are left in tension. If a general standard key were used as the key 380, it would be difficult to remove and replace the drive motor. Attempting to do so in this state could damage the connection between the drive shaft 310 and the rotating arm 320. In order to obviate this potential problem, the height of the key 380 is preferably a little less than the height of the key way 312, and the key 380 and the key way 312 have the same width.

Figure 12:
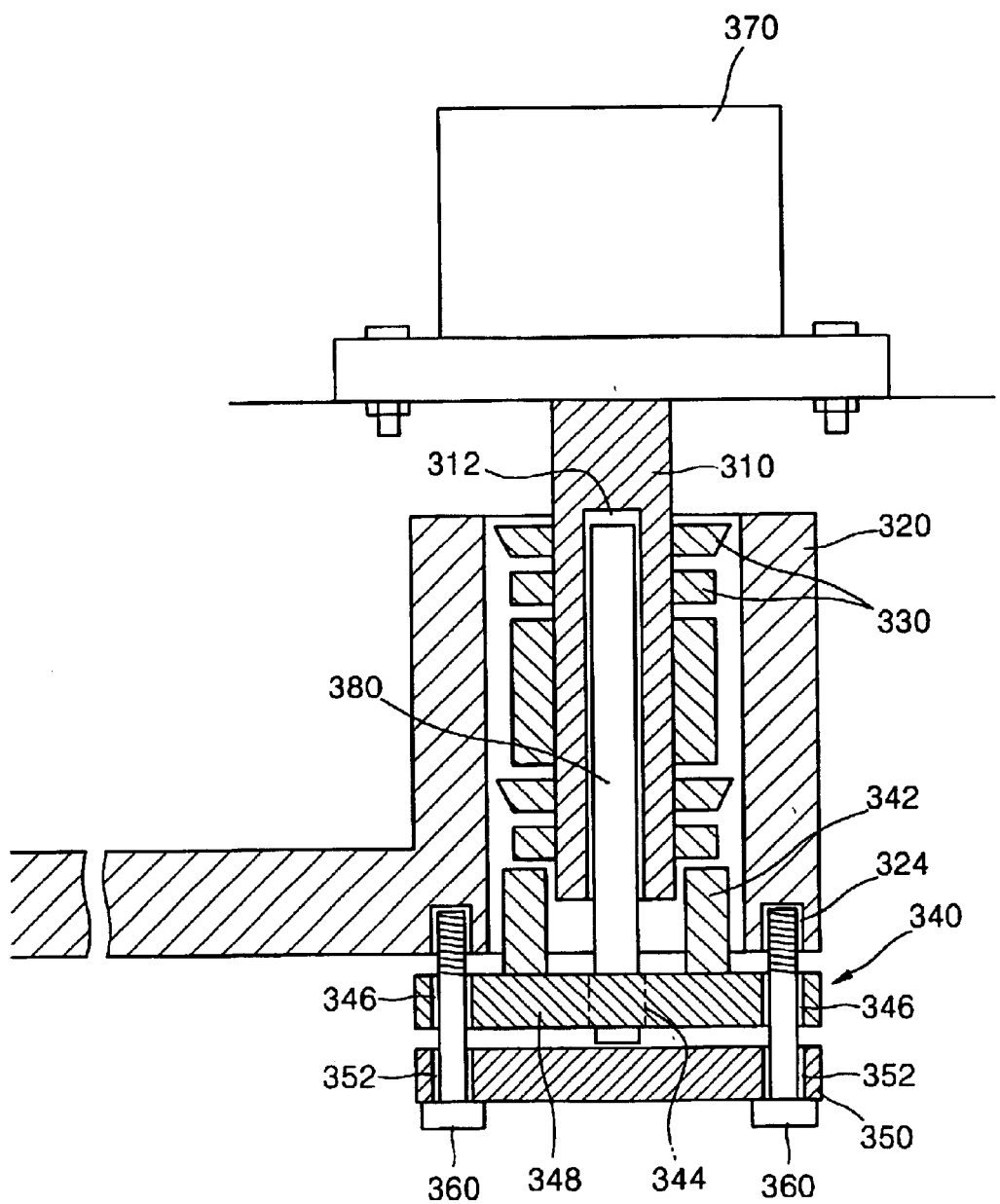
FIG. 12 is a cross-sectional view of a system in which a rotating arm is connected to a drive shaft for controlling the Y-axis tilt of a wafer platen of an ion implanter according to a second embodiment of the present invention.
Figure 13:
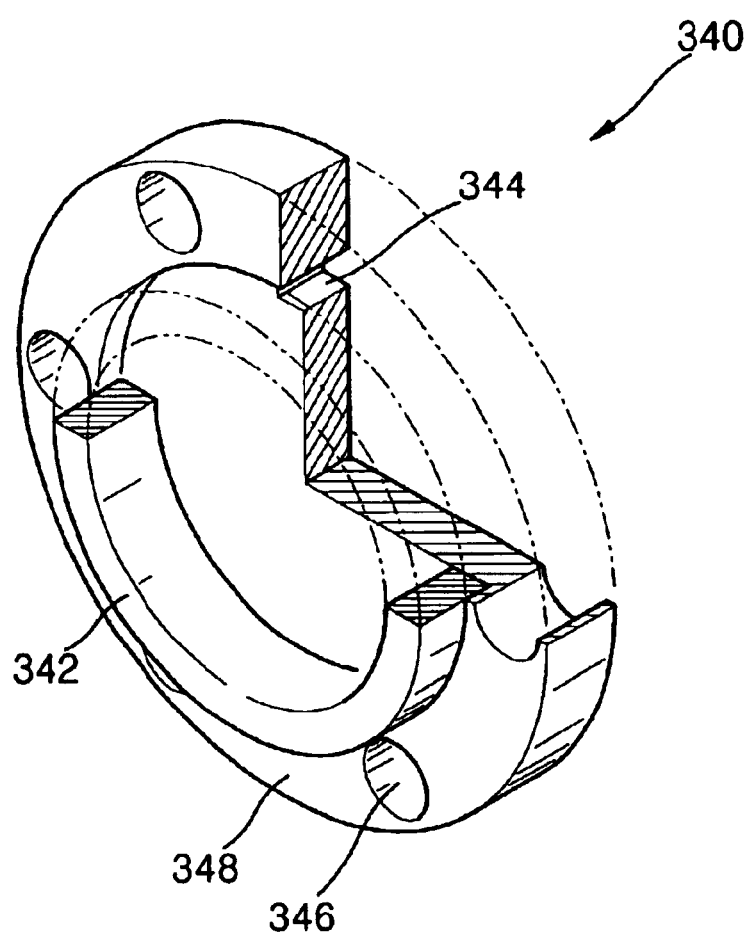
FIG. 13 is a perspective view of a bracket of the system shown in FIG. 12.
Figure 14A:
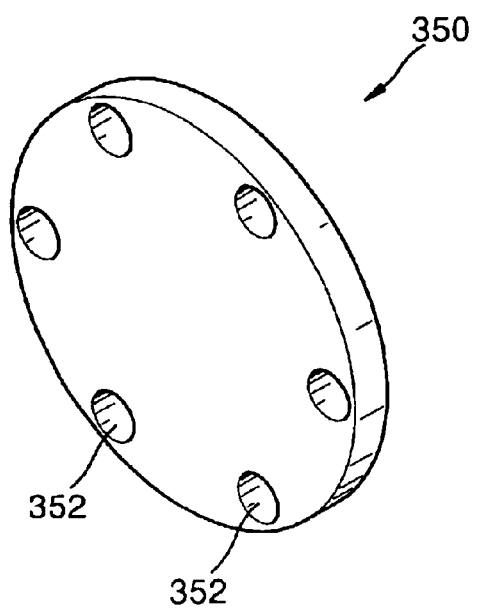
FIG. 14A is a perspective view of an end cap of the same system.
Figure 14B:
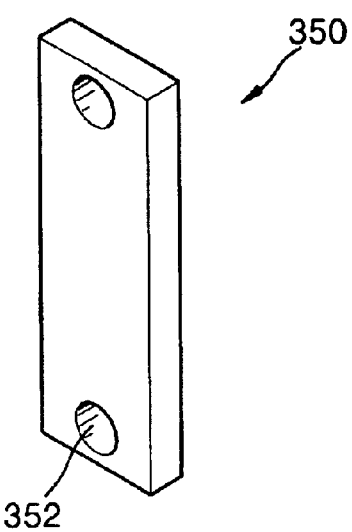
FIG. 14B is a perspective view of an alternative form of the end cap.

Referring to FIGS. 12, 14A, and 14B, the end cap 350 is positioned over the keyhole 344 of the bracket 340, and has a plurality of screw holes 352 adjacent the outer periphery thereof. The screw holes 346 of the bracket 340 are opposed to the internally threaded holes 324 of the rotating arm 320. The end cap 350 may be a flat plate having the same shape and size as the bracket 340, as shown in FIG. 14A.

Preferably, the end cap 350 has the same number of screw holes 346 as the bracket 340. The end cap 350 may also be a rectangular plate of sufficient width to cover the keyhole 344, as shown in FIG. 14B. In this case, the end cap 350 preferably has two screw holes 352.

The bracket 340 is completely joined to the rotating arm 350 by four of the six screws 360. Accordingly, the pressure ring 342 is pressed into engagement with the ferrules 330. The end cap 350 is joined to the rotating arm 320 by the remaining two screws 360. The two screws 360 extend through the screw holes 352 of the end cap 350, the screw holes 346 of the bracket and into engagement with the threads of the holes 324 of the rotating arm 320 to force the end cap 350 against the key 380. The key 380 is thus prevented from coming out of the key way 312 due to the swaying of the rotating arm 320. The screws 360 are preferably made of SUS which is thermally treated.

FIGS. 15 through 18 illustrate a third embodiment of a transmission mechanism of an X-axis or a Y-axis tilt assembly of an ion implanter according to the present invention. For purposes of description only, the second embodiment will be described in connection with the follower pulley and shaft of the transmission mechanism of an X-axis tilt assembly of an ion implanter, although this embodiment is equally applicable to the drive shaft and drive pulley.

Figure 15:
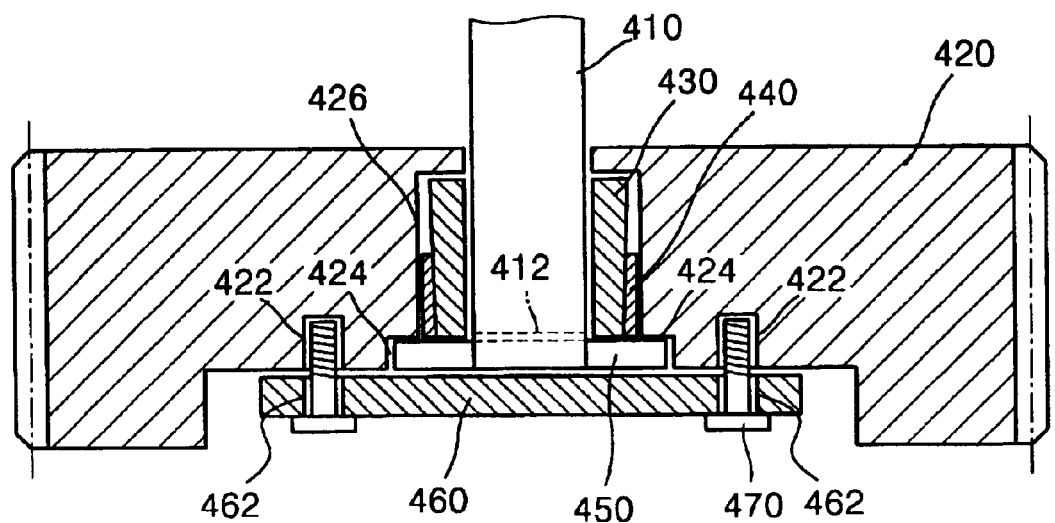
FIG. 15 is a cross-sectional view of a system in which a follower pulley is connected to a follower shaft for controlling the X-axis tilt of a wafer platen of an ion implanter according to a third embodiment of the present invention.

Referring to FIG. 15, the transmission mechanism includes a follower shaft 410, a follower pulley 420 connected to the following shaft 410, a spacer 430, a nut 440, a key 450, an end cap 460, and screws 470. The shaft 410 has a key way 412 formed in the end surface thereof for receiving part of the key 450. The follower pulley 420 has internally threaded holes 422 for receiving the screws 470, and a key way 424 for receiving part of the key 450. The spacer 430 and the nut 440 are disposed in a boss 426 of the follower pulley 420 as interposed between the follower shaft 410 and the follower pulley 420. The end cap 460 covers the key 450 and has a plurality of screw holes 462 adjacent the outer circumference thereof. The screw holes are disposed opposite the internally threaded holes 422 of the follower pulley 420, respectively. The screws 470 extend through the screw holes 462 of the end cap 460 and are threaded to the pulley 420 within the internally threaded holes 422.

Figure 16:
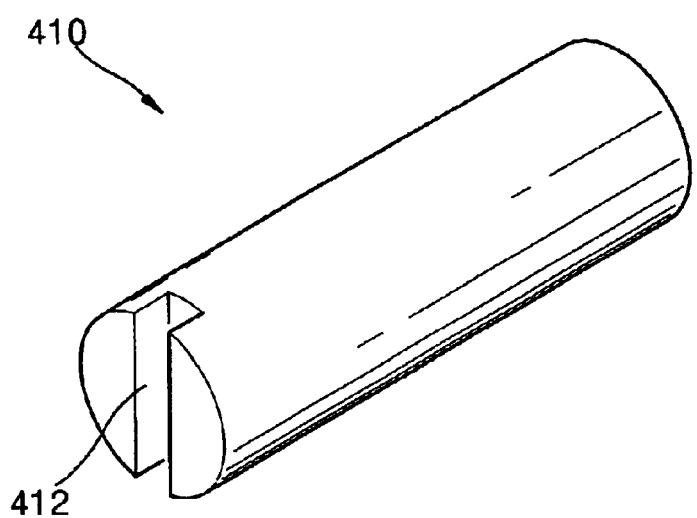
FIG. 16 is a perspective view of the follower shaft of the system shown in FIG. 15.
Figure 17:
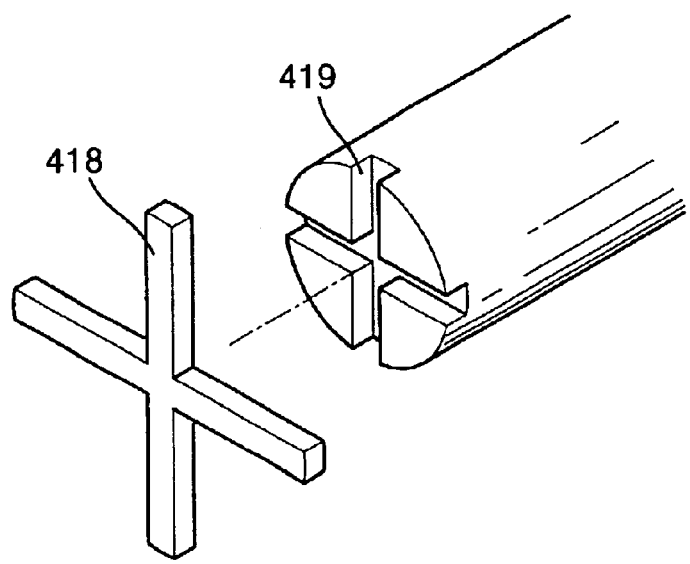
FIG. 17 is perspective view of another form of the follower shaft along with a key associated therewith.

Referring to FIGS. 15 and 16, the key way 412 and the key 450 preferably have rectangular cross sections. In one form of the present invention, the key way 412 extends linearly across the axis of rotation of the rotary shaft 410 at the end of the rotary shaft 410. Preferably, the widths of the key 450, the key way 412 and the key way 424 are equal, and the thickness of the key 450 is greater than the depths of the key way 412 and the key way 424. Alternatively, if necessary, the follower shaft may have a cross-shaped key way 419, and a cross-shaped key 418 may be received in the key way 419 as shown in FIG. 17.

Also, the nut 440 tightens the spacer 430 to the outside of the follower shaft 410. Lock-tite© is preferably applied to the outside of the follower shaft 410 to adhere the spacer 430 to the follower shaft 410. Lock-tite© is also applied to the inside of the nut 440, before the nut 440 is tightened, to prevent the nut 440 from loosening and thereby prevent the follower shaft 410 from coming off of the nut 440. The spacer 430 contacts both the follower shaft 410 and the follower pulley 420 and directly transmits rotary force between the follower shaft 410 and the follower pulley 420.

Figure 18:
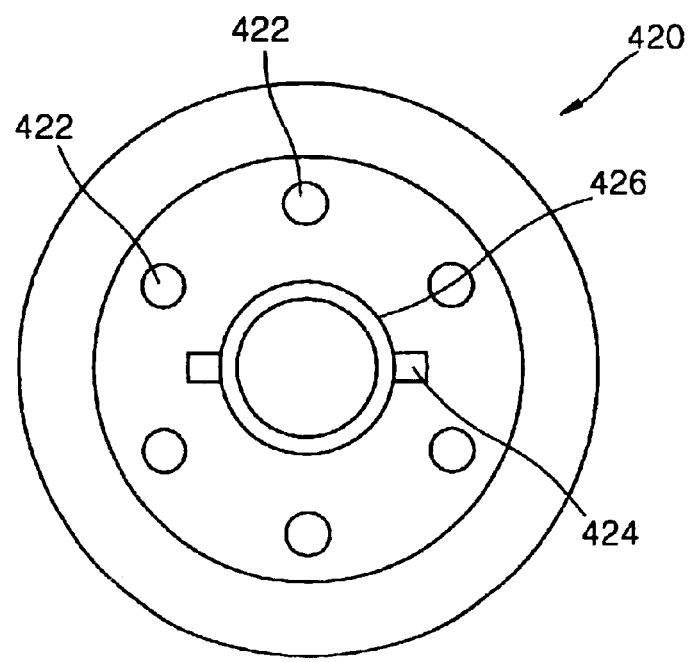
FIG. 18 is a front view of the follower pulley.

Referring to FIGS. 15 and 18, a plurality of internally threaded holes 422 and a key way 424 are formed in one side of the following pulley 420. The follower shaft 410 extends into the boss 426 of the follower pulley 420. The key 450 causes the follower shaft 410 and the following pulley 420 to rotate as one. To this end, the key way 424 preferably has the same cross section as the key way 412, and the bottom surface of the key way 424 lies in the same plane as the bottom surface of the key way 412. The follower pulley 420 is preferably made of steel so that it is not damaged by the key 450 and the screws 470. The internally threaded holes 422 of the follower pulley 420 allow the end cap 460 to be fixed to the follower pulley 420. There are preferably six internally threaded holes 422.

Referring to FIG. 15, the end cap 460 is a circular flat plate and has screw holes at the circumference thereof opposite the internally threaded holes 422. The end cap 460 has the same number of internally threaded holes as the follower pulley 420. The screws 462 join the end cap 460 to the following pulley 420 so that the end cap 460 keeps the key 450 in the key ways 412 and 424. As a result, the follower shaft 410 and the follower pulley 420 rotate together without slipping relative to each other.

Figure 1:
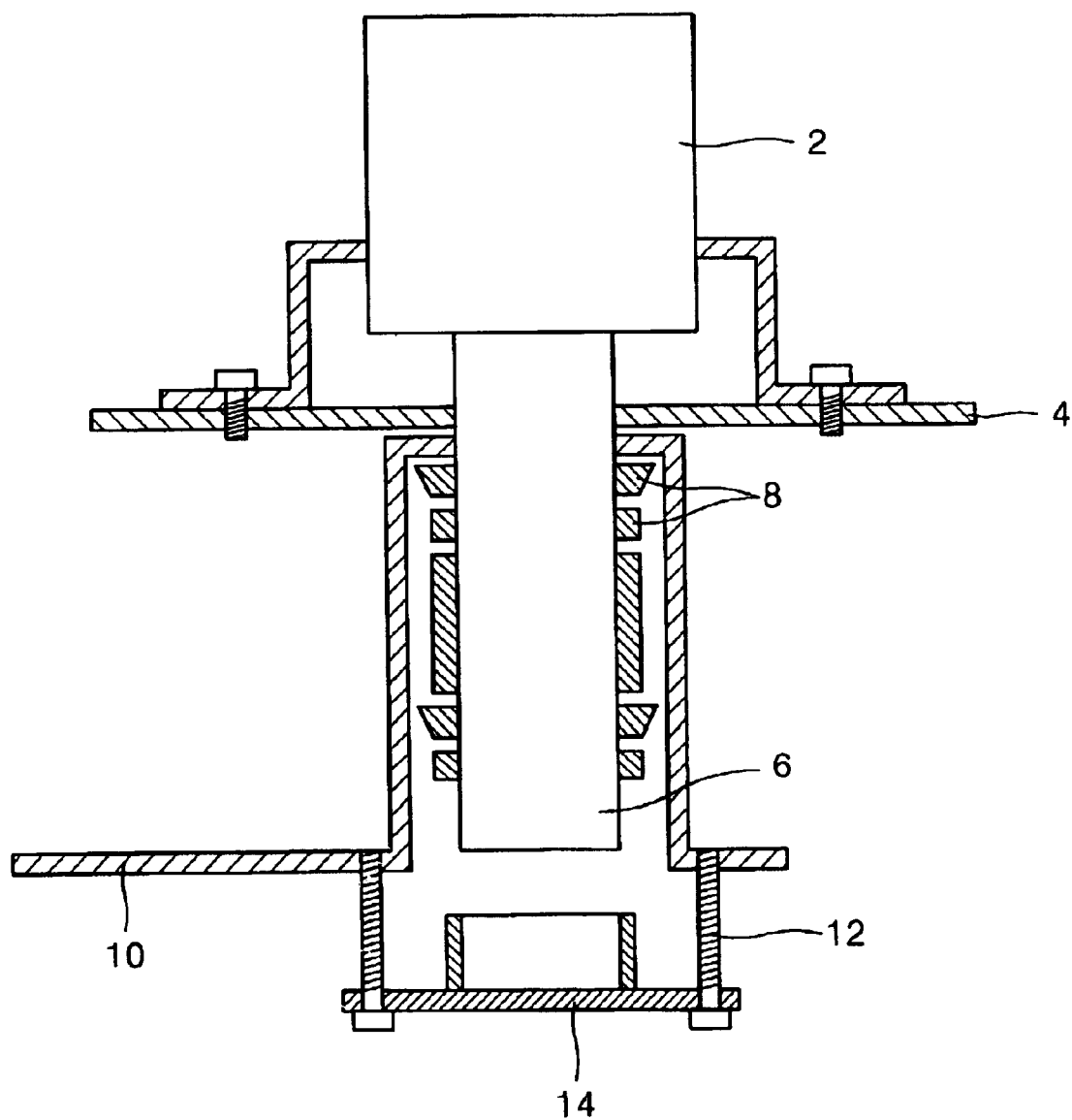
FIG. 1 is a cross-sectional view of a system in which a rotating arm is connected to a drive shaft for controlling the Y-axis tilt of a wafer platen of an ion implanter according to the prior art.
Figure 2:
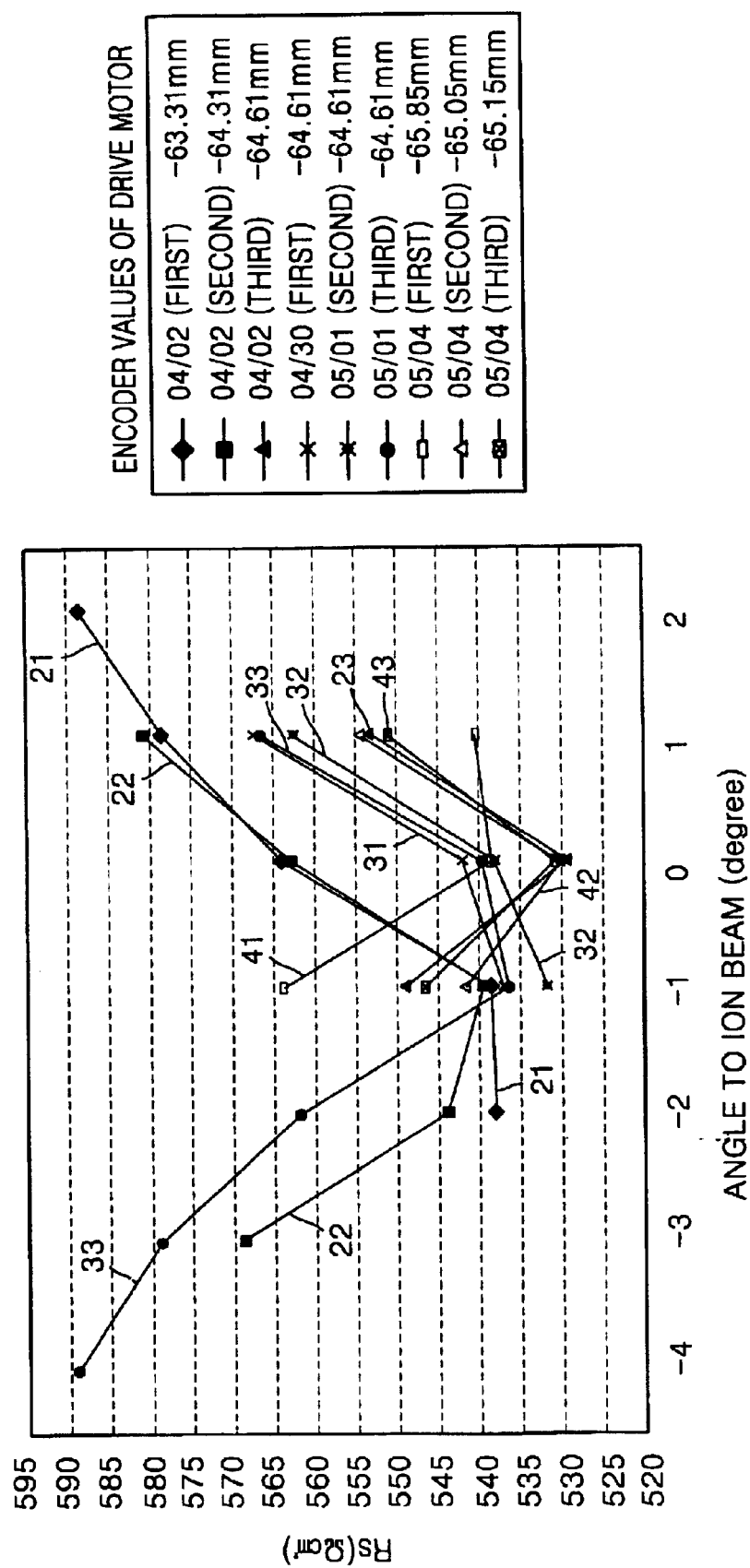
FIG. 2 is a graph showing encoder values and surface resistance values of a drive motor of the system shown in FIG. 1 for controlling the Y-axis tilt.
Figure 3:
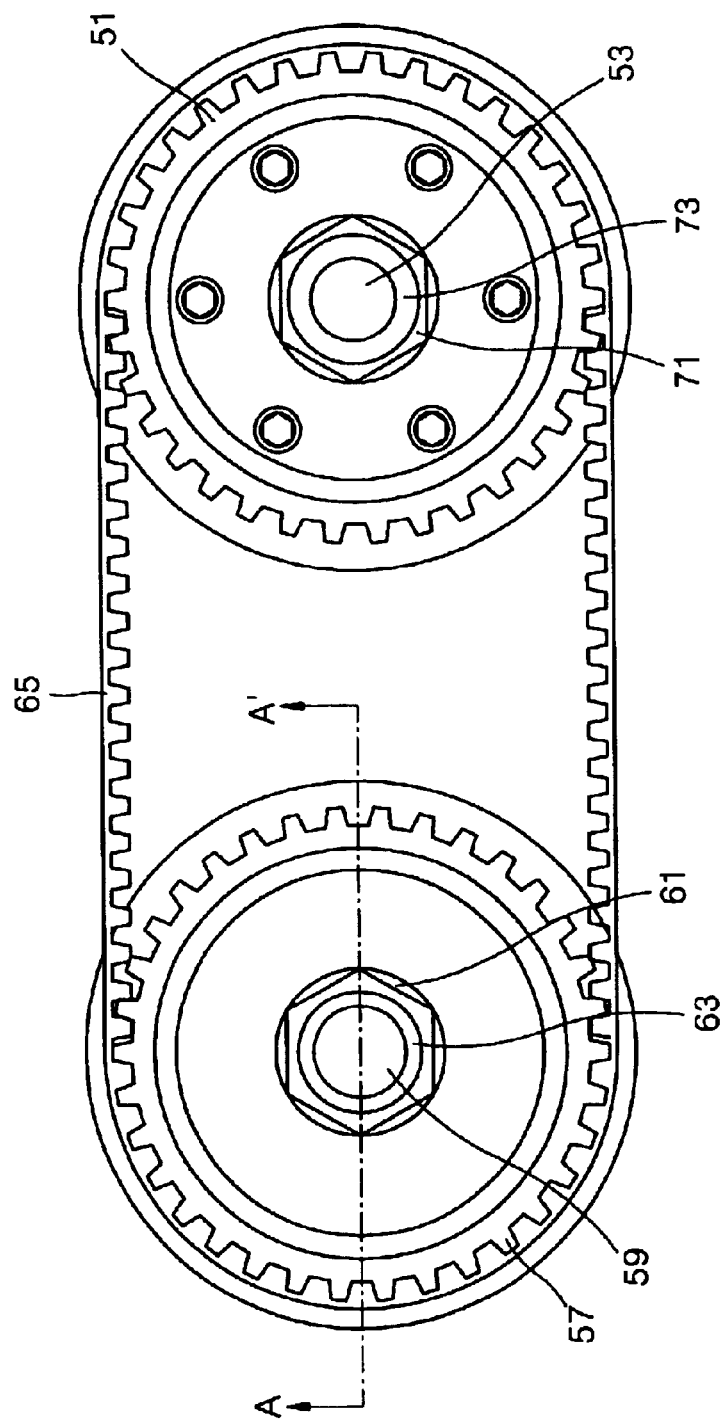
FIG. 3 is a side view of a pulley system for controlling the X-axis tilt in an ion implanter according to the prior art.
Figure 4:
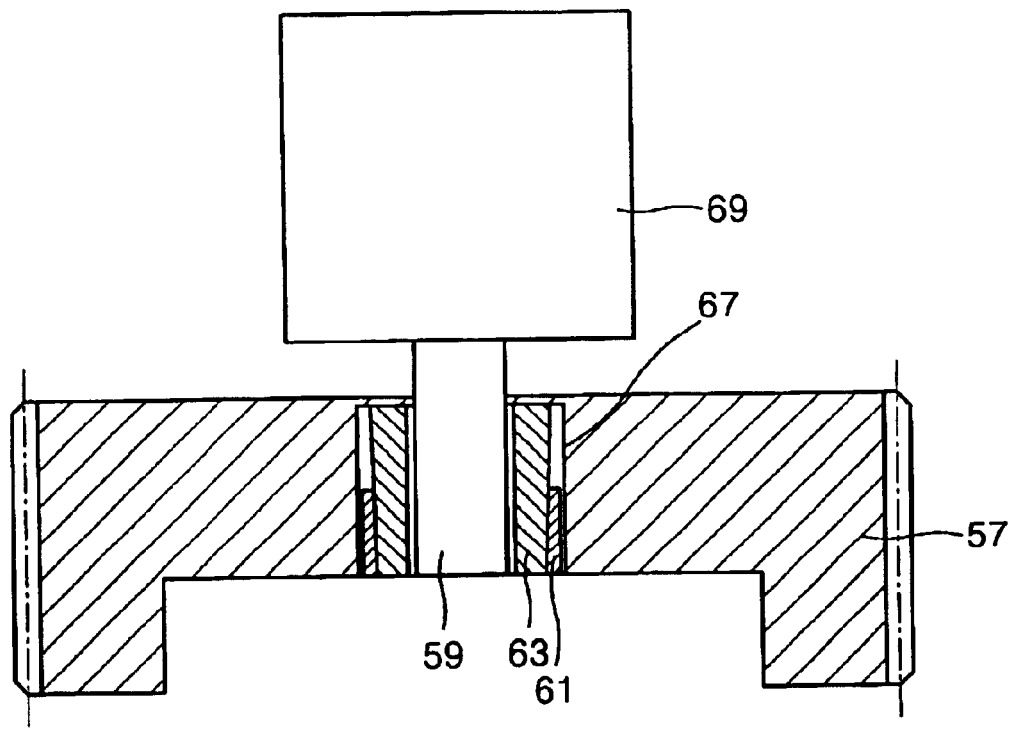
FIG. 4 is a cross-sectional view of the pulley system taken along line A–A' of FIG. 3, showing the connection of a follower pulley of the system to a rotary shaft.

In the transmission mechanism of the X-axis tilt assembly according to the prior art shown in FIG. 3, if the drive motor starts and stops suddenly, slip occurs between the rotary shaft and the spacer, and the nut tightening the spacer is loosened. However, in the above-described embodiment of the present invention, the key 412 or 418 and the end cap 460 prevent the rotary shaft 410 and the pulley 420 form slipping relative to each other, and prevent and the nut 440 from loosening around the spacer 430.

Figure 19:
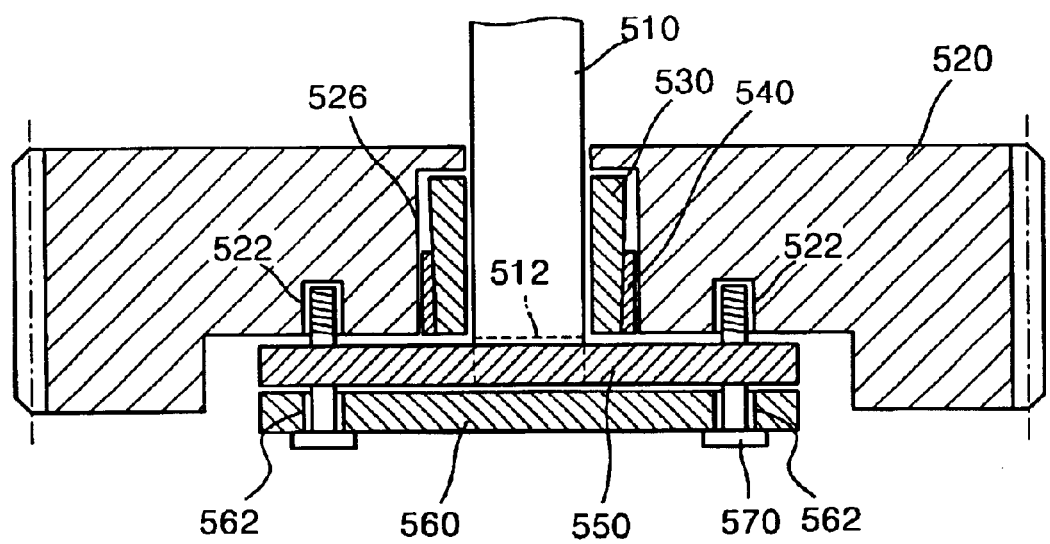
FIG. 19 is a cross-sectional view of a system in which a rotary shaft and a pulley are connected in an ion implanter according to a fourth embodiment of the present invention.

FIG. 19 another embodiment of a system in which a rotating body is connected to a rotary shaft according to the present invention. This embodiment can be applied to a transmission mechanism of either an X-axis or a Y-axis tilt assembly of an ion implanter. For purposes of description only, the embodiment will be described below with reference to the connection between a follower shaft and a follower pulley for controlling the X-axis tilt of a wafer platen, although the embodiment is equally applicable to the drive shaft and drive pulley of the mechanism.

Referring to FIG. 19, the transmission mechanism includes a follower shaft 510, a follower pulley 520, a spacer 530, a nut 540, a key 550, an end cap 560, and screws 570. The spacer 530 and the nut 540 are disposed in a boss 526 of the follower pulley 520 as interposed between the following shaft and the follower pulley 520. The follower shaft 510 has a key way 512 in one end thereof. The key way 512 extends across the central axis of rotation of the follower shaft 510 at the end surface thereof. Preferably, the cross section of the key way 512 is rectangular. The follower pulley 520 has a recess and plurality of internally threaded holes 522 in one side thereof. The recess accommodates the key 550 and the end of the follower shaft 510 having the key way 512. The internally threaded holes 522 open to the recess so as to receive the screws 570. The end cap 560 is joined to the follower pulley 520 by the screws 570 such that the end cap 560 maintains the key 550 in the key way 512 of the follower shaft 510 and at he same time presses the key 550 against the follower pulley.

The function, operation, and effect of these components are similar to those of the previous embodiment.

Figure 20:
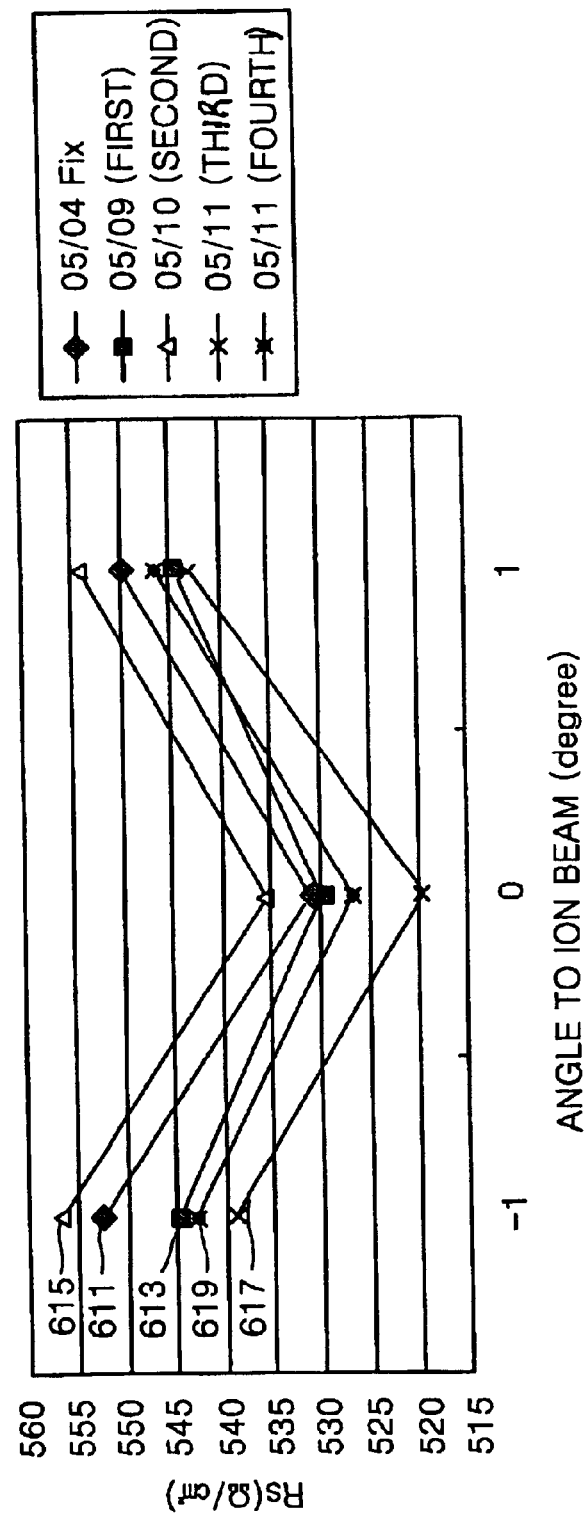
FIG. 20 is a graph showing surface resistance values according to X-axis tilt using an X-axis tilt assembly employing the embodiment of FIG. 19.

FIG. 20 is a graph showing surface resistance values according to X-axis tilt using a system in which the follower shaft and follower pulley of the transmission mechanism are connected as shown in FIG. 19. Referring to FIG. 20, reference numeral 611 designates a plot of surface resistance values according to the angle of an ion beam after the zero point of the X-axis tilt was set using the system. First (613), second (615), third (617), and fourth (619) measurements were obtained by operating the drive motor according to an encoder value of the drive motor corresponding to the zero point of the X-axis tilt. The surface resistance values hardly changed when the angle of the ion beam was on, and the surface resistance values at the angles of −1−+1° were symmetrical. Thus, it is apparent that the assembly for controlling the X-axis tilt of the wafer platen operates very stably, and that the transmission mechanism can stably transmit the rotary force of the drive motor to the wafer platen.

Figure 21:
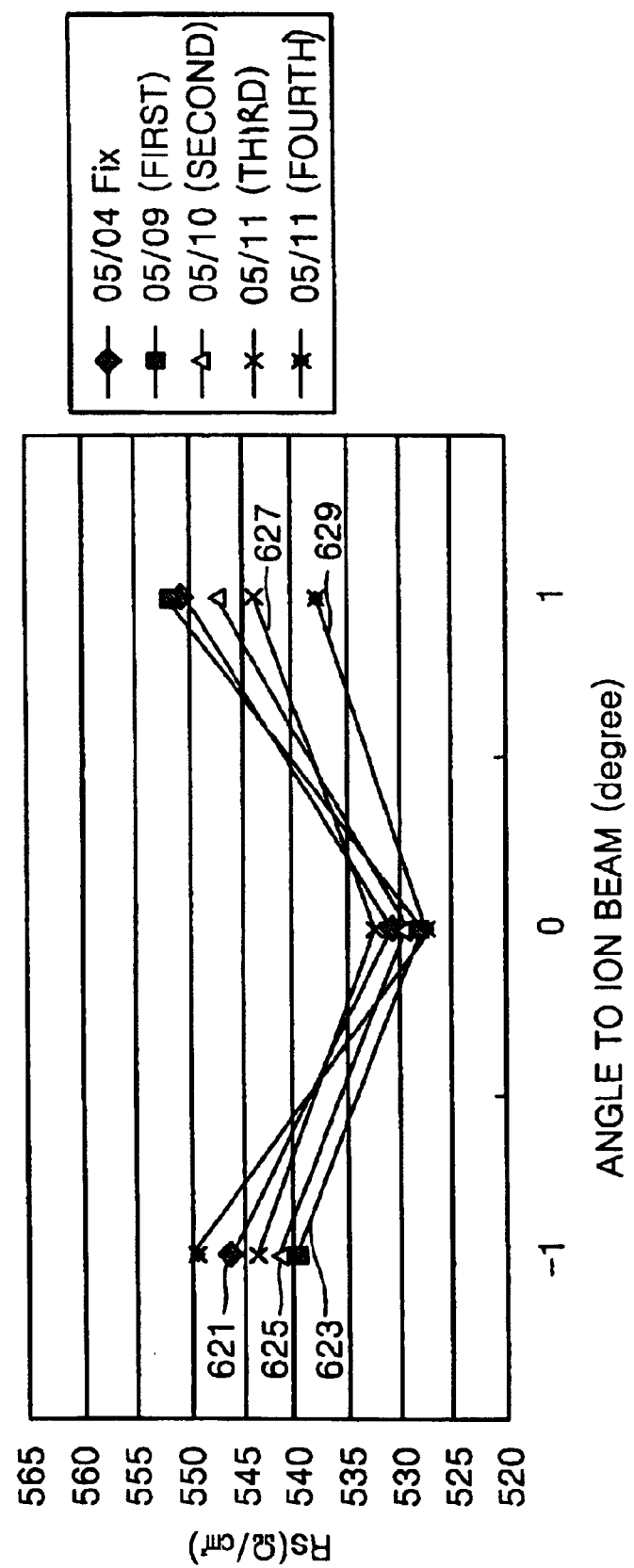
FIG. 21 is a graph showing surface resistance values according to Y-axis tilt using a Y-axis tilt assembly employing the embodiment of FIG. 12.

FIG. 21 is a graph showing surface resistance values according to Y-axis tilt using a system in which the drive shaft and the rotating arm are connected as shown in FIG. 12. Referring to FIG. 21, reference numeral 621 designates a plot of surface resistance values according to the angle of an ion beam after the zero point of the Y-axis tilt was set using the system. First (623), second (625), third (627), and fourth (629) measurements were obtained by operating the drive motor according to an encoder value corresponding to the zero point of Y-axis tilt. The surface resistance values hardly changed when the angle of the ion beam was 0°, and surface resistance values at the angles of −1−+1° were symmetrical. Thus, it is apparent that the wafer platen was operated very stably by the present invention.

Finally, although the present invention has been described above in connection with the preferred embodiments thereof, various changes to and modifications of the preferred embodiments will become apparent to those of ordinary skill in the art. All such changes and modifications are seen to be within the true spirit and scope of the present invention as defined by the appended claims.

What is claimed is:

1. In an ion implanter, a transmission mechanism for transmitting rotary force to a wafer platen of the implanter, said mechanism comprising:
   a rotary shaft having a central longitudinal axis of rotation, an end surface, a key way extending longitudinally in a body of the shaft parallel to the axis of rotation thereof, and at least one internal threaded hole open at the end surface;
   a rotating body having a side surface, a boss into which said rotary shaft extends, and a plurality of internally threaded holes open at the side surface thereof, said boss defining a protrusion engaged with said rotary shaft within the key way thereof;
   an end cap having screw holes opposite the internally threaded holes of said rotary shaft and said rotating body, respectively; and
   a plurality of screws extending through the screw holes in the end cap and threaded to said rotary shaft and said rotating body via the internally threaded holes thereof such that the end cap and screws fix the rotary shaft to said rotating body.

2. The mechanism of claim 1, wherein the key way is open to the outer circumferential surface of said rotary shaft and has a bottom and sides that extend perpendicular to each other.

3. The mechanism of claim 1, wherein the at least one internally threaded hole of said rotary shaft consists of a single internally threaded hole open at the center of said end surface of the shaft.

4. The mechanism of claim 1, wherein the rotating body is a rotating arm of a Y-axis tilt assembly for controlling the tilt of the wafer platen about a vertical Y-axis.

5. The mechanism of claim 1, wherein the rotating body is a pulley of an X-axis tilt assembly for controlling the tilt of the wafer platen.

6. The mechanism of claim 1, wherein said rotating body is of steel.

7. The mechanism of claim 1, wherein said rotating body has six of said internally threaded holes open at the side surface thereof.

8. The mechanism of claim 1, wherein the end cap is a flat plate.

9. The mechanism of claim 1, wherein the screws are formed of thermally treated SUS.

10. In an ion implanter, a transmission mechanism for transmitting rotary force to a wafer platen of the implanter, said mechanism comprising:
    a rotary shaft having a central longitudinal axis of rotation, and a key way extending therein parallel to said axis of rotation;
    a rotating body having a boss into which the revolving shaft extends, and a plurality of internally threaded holes;
    a ferrule disposed in said boss and extending between said rotary shaft and said rotating body;
    a bracket having a supporting plate, and a ring protruding from said supporting plate and exerting a force on said ferrule, said supporting plate having a keyhole therein and screw holes disposed opposite the internally threaded holes of said rotating body;
    a key embedded in said supporting plate within the keyhole thereof, and extending therefrom into the key way as engaged with said rotary shaft so as to rotate therewith;
    an end cap covering the keyhole, and having screw holes disposed opposite the screw holes of said bracket, respectively; and
    a plurality of screws extending through said screw holes and threaded to said rotating body via said internal threaded holes thereof, said screws joining said bracket and said end cap to said rotating body.

11. The mechanism of claim 10, wherein the key way has a bottom and sides extending perpendicular to each other.

12. The mechanism of claim 10, wherein the rotating body is a rotating arm of a Y-axis tilt assembly for controlling the tilt of the wafer platen about a vertical Y-axis.

13. The mechanism of claim 12, wherein said rotating arm is of steel.

14. The mechanism of claim 10, wherein said rotating body has six of said internally threaded holes.

15. The mechanism of claim 10, wherein said supporting plate is a flat plate.

16. The mechanism of claim 10, wherein the pressure ring of said bracket protrudes from the supporting plate into pressing engagement with said ferrule.

17. The mechanism of claim 10, wherein said key has an end that is spaced from the end of said key within said rotary shaft.

18. The mechanism of claim 10, wherein the cross section of said keyhole has the same shape and size as that of said key.

19. The mechanism of claim 10, wherein end cap is a flat plate of the same size as said bracket.

20. The mechanism of claim 19, wherein said end cap has the same number of said screw holes as said bracket.

21. The mechanism of claim 10, wherein the end cap is a rectangular flat plate.

22. The mechanism of claim 21, wherein said end cap has only two of said screw holes.

23. The mechanism of claim 10, wherein said screws are thermally treated of SUS.

24. In an ion implanter, a transmission mechanism for transmitting rotary force to a wafer platen of the implanter, said mechanism comprising:

a rotary shaft having a central longitudinal axis of rotation, an end surface, and a key way extending in said end surface perpendicular to the axis of rotation;

a rotating body having a boss into which the rotary shaft extends, and a plurality of internally threaded holes and a key way open at one side thereof;

a spacer disposed in said boss of the rotating body as interposed between the rotating body and the rotary shaft;

a nut tightening the spacer against the rotary shaft at the outside of the spacer;

a key fitted in the key ways of said rotating body and rotary shaft;

an end cap contacting the key and having screw holes adjacent the outer circumference thereof, said screw holes being disposed opposite respective ones of the internally threaded holes of said rotating body; and screws extending through the screw holes of said end cap and threaded to said rotating body via the internally threaded holes thereof, and thereby joining the end cap to the rotating body.

25. The mechanism of claim 24, wherein the key way of said rotary shaft crosses the central axis of rotation of said shaft.

26. The mechanism of claim 24, wherein the key way of said rotary shaft has a rectangular cross section.

27. The mechanism of claim 24, wherein said rotating body is a pulley.

28. The mechanism of claim 24, wherein the rotating body is of steel.

29. The mechanism of claim 24, wherein said rotating body has six of said internally threaded holes.

30. The mechanism of claim 24, wherein the cross section of the key way of said rotating body has the same shape as that of the key way of said rotary shaft.

31. The mechanism of claim 24, wherein the key way of said rotating body has a bottom surface that lies in the same plane as that of the key way of said rotary shaft.

32. The mechanism of claim 24, wherein said end cap has the same number of said screw holes as the number of said internally threaded holes of said rotating body.

33. The mechanism of claim 24, wherein the widths of said key, the key way of said rotary shaft, and the key way of said rotating body are equal.

34. The mechanism of claim 24, wherein said key has a thickness greater than the depths of each of said key ways.

35. The mechanism of clam 24, wherein the end cap is a flat plate.

36. The mechanism of claim 24, wherein the screws are of thermally treated SUS.

37. In an ion implanter, a transmission mechanism for transmitting rotary force to a wafer platen of the implanter, said mechanism comprising:

a rotary shaft having a central longitudinal axis of rotation, an end surface, and a key way extending in said end surface perpendicular to the axis of rotation;

a rotating body having a boss into which the rotary shaft extends, and a plurality of internally threaded holes open at one side thereof;

a spacer disposed in said boss of the rotating body as interposed between the rotating body and the rotary shaft;

a nut tightening the spacer against the rotary shaft at the outside of the spacer;

a key fitted in the key ways of said rotary shaft;

an end cap contacting the key and having screw holes adjacent the outer circumference thereof, said screw holes being disposed opposite respective ones of the internally threaded holes of said rotating body; and screws extending through the screw holes of said end cap and threaded to said rotating body via the internally threaded holes thereof, and thereby joining the end cap to the rotating body.

38. The mechanism of claim 37, wherein the key way of said rotary shaft crosses the central axis of rotation of said shaft.

39. The mechanism of claim 37, wherein the key way of said rotary shaft has a rectangular cross section.

40. The mechanism of claim 37, wherein said rotating body is a pulley.

41. The mechanism of claim 37, wherein the rotating body is of steel.

42. The mechanism of claim 37, wherein said end cap has the same number of said screw holes as the number of said internally threaded holes of said rotating body.

43. The mechanism of claim 37, wherein the width of said key is equal to the width of the key way of said rotary shaft.

* * * * *